(12) United States Patent
Creazzo et al.

(10) Patent No.: US 9,318,868 B2
(45) Date of Patent: *Apr. 19, 2016

(54) TUNABLE HYBRID LASER WITH CARRIER-INDUCED PHASE CONTROL

(75) Inventors: Timothy Creazzo, Albuquerque, NM (US); Amit Mizrahi, Albuquerque, NM (US); Stephen B. Krasulick, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/605,633

(22) Filed: Sep. 6, 2012

(65) Prior Publication Data

US 2013/0235890 A1 Sep. 12, 2013

Related U.S. Application Data

(60) Provisional application No. 61/532,050, filed on Sep. 7, 2011.

(51) Int. Cl.
*H01S 5/00* (2006.01)
*H01S 3/10* (2006.01)
(Continued)

(52) U.S. Cl.
CPC ........... *H01S 3/10053* (2013.01); *H01S 5/1007* (2013.01); *H01S 5/142* (2013.01); *H01S 3/106* (2013.01); *H01S 3/1055* (2013.01); *H01S 5/0612* (2013.01)

(58) Field of Classification Search
CPC ..... H01S 3/0635; H01S 3/10; H01S 3/10023; H01S 3/1003; H01S 3/10053; H01S 5/0607; H01S 5/0612; H01S 5/18302; H01S 5/4068; H01S 5/1007

USPC ............. 372/12, 20, 29.023, 50.1, 50.11, 81, 372/102

See application file for complete search history.

(56) References Cited

U.S. PATENT DOCUMENTS 5,319,667 A 6/1994 Dutting et al.
5,333,219 A 7/1994 Kuznetsov
(Continued)

FOREIGN PATENT DOCUMENTS

WO 2011/046898 A1 4/2011

OTHER PUBLICATIONS

Wesström et al., "Design of a Widely Tunable Modulated Grating Y-branch Laser Using the Additive Vernier Effect for Improved Super-Mode Selection," IEEE 18th International Semiconductor Laser Conference, 2002, 99-100; retrieved from the Internet: <http://photonics.intec.ugent.be/download/pub_1603.pdf>.
(Continued)

*Primary Examiner* — Yuanda Zhang
(74) *Attorney, Agent, or Firm* — Kilpatrick Townsend & Stockton LLP

(57) ABSTRACT

A tunable laser includes a substrate comprising a silicon material, a gain medium coupled to the substrate, wherein the gain medium includes a compound semiconductor material, and a waveguide disposed in the substrate and optically coupled to the gain medium. The tunable laser also includes a first wavelength selective element characterized by a first reflectance spectrum and disposed in the substrate and a carrier-based phase modulator optically coupled to the first wavelength selective element. The tunable laser further includes a second wavelength selective element characterized by a second reflectance spectrum and disposed in the substrate, an optical coupler disposed in the substrate and optically coupled to the first wavelength selective element, the second wavelength selective element, and the waveguide, and an output mirror.

20 Claims, 15 Drawing Sheets

(51) Int. Cl.
  *H01S 5/10* (2006.01)
  *H01S 5/14* (2006.01)
  *H01S 3/1055* (2006.01)
  *H01S 3/106* (2006.01)
  *H01S 5/06* (2006.01)

(56) References Cited

U.S. PATENT DOCUMENTS

| | | | |
|---|---|---|---|
| 5,757,986 A * | 5/1998 | Crampton et al. | 385/2 |
| 5,987,050 A | 11/1999 | Doerr et al. | |
| 6,192,058 B1 | 2/2001 | Abeles | |
| 6,714,566 B1 | 3/2004 | Coldren et al. | |
| 6,728,279 B1 | 4/2004 | Sarlet et al. | |
| 7,058,096 B2 | 6/2006 | Sarlet et al. | |
| 8,368,995 B2 | 2/2013 | Dallesasse et al. | |
| 8,559,470 B2 | 10/2013 | Dallesasse et al. | |
| 8,867,578 B2 | 10/2014 | Dallesasse et al. | |
| 2002/0197013 A1 | 12/2002 | Liu et al. | |
| 2003/0128724 A1 | 7/2003 | Morthier | |
| 2004/0037342 A1 | 2/2004 | Blauvelt et al. | |
| 2004/0228384 A1 | 11/2004 | Oh et al. | |
| 2005/0129361 A1 * | 6/2005 | Kim et al. | 385/37 |
| 2005/0213618 A1 | 9/2005 | Sochava et al. | |
| 2005/0226284 A1 | 10/2005 | Tanaka et al. | |
| 2006/0002443 A1 * | 1/2006 | Farber et al. | 372/50.1 |
| 2007/0280326 A1 | 12/2007 | Piede et al. | |
| 2009/0016399 A1 * | 1/2009 | Bowers | 372/50.21 |
| 2010/0142567 A1 * | 6/2010 | Ward et al. | 372/20 |
| 2011/0007761 A1 * | 1/2011 | Assefa et al. | 372/34 |
| 2011/0085572 A1 * | 4/2011 | Dallesasse et al. | 372/20 |
| 2011/0085577 A1 | 4/2011 | Krasulick et al. | |
| 2011/0267676 A1 | 11/2011 | Dallesasse et al. | |
| 2012/0057079 A1 | 3/2012 | Dallesasse et al. | |
| 2012/0057609 A1 | 3/2012 | Dallesasse et al. | |

OTHER PUBLICATIONS

Wesström et al., "State-of-the-Art Performance of Widely Tunable Modulated Grating Y-Branch Lasers," Optical Fiber Communication Conference, Technical Digest (CD) (Optical Society of America, 2004), paper TuE2.
US Non-Final Office Action mailed on Mar. 13, 2012 for U.S. Appl. No. 13/040,179, filed Mar. 3, 2011, 14 pages.
US Final Office Action mailed on Aug. 13, 2012 for U.S. Appl. No. 13/040,179, filed Mar. 3, 2011, 20 pages.
US Non-Final Office Action mailed on Dec. 12, 2012 for U.S. Appl. No. 13/040,179, filed Mar. 3, 2011, 17 pages.

* cited by examiner

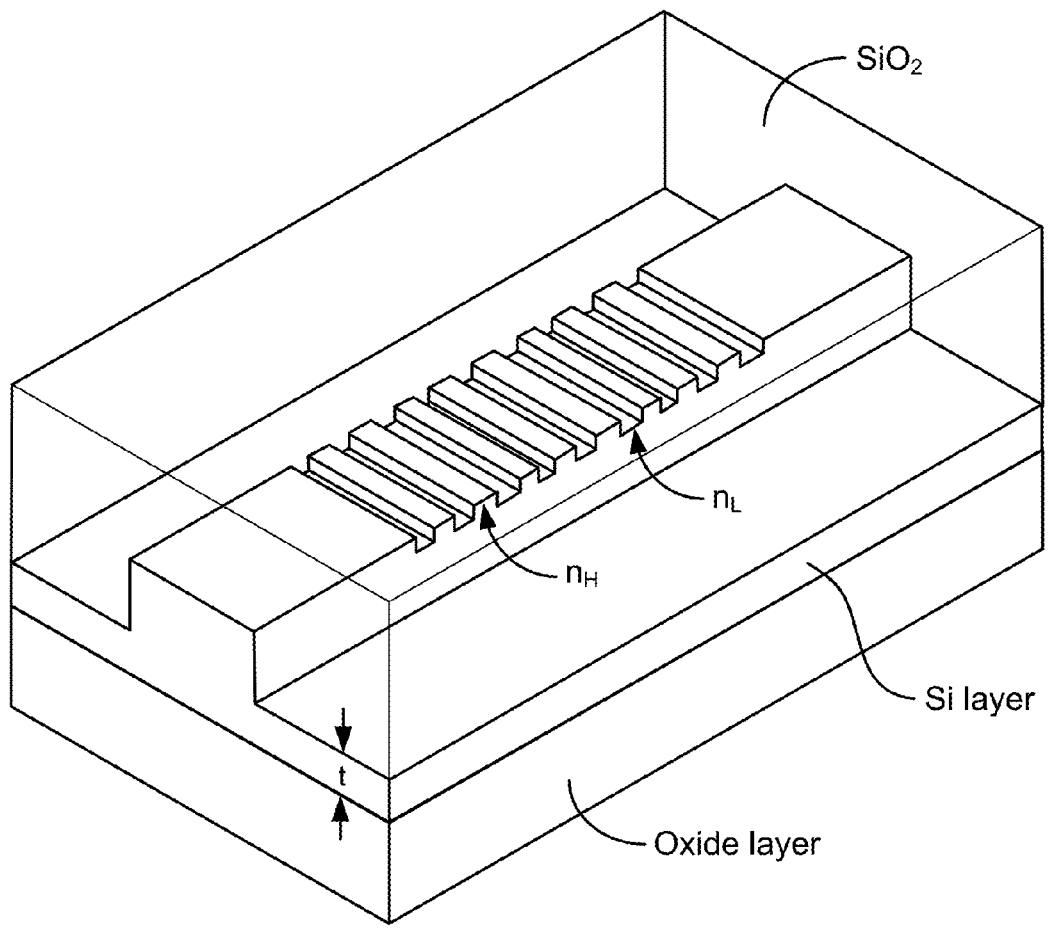
FIG. 3A
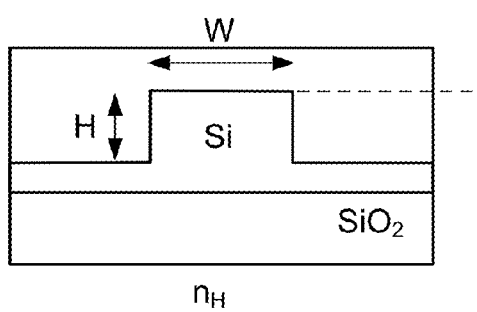
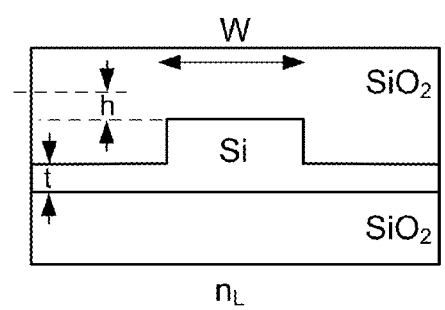
FIG. 3B  FIG. 3C

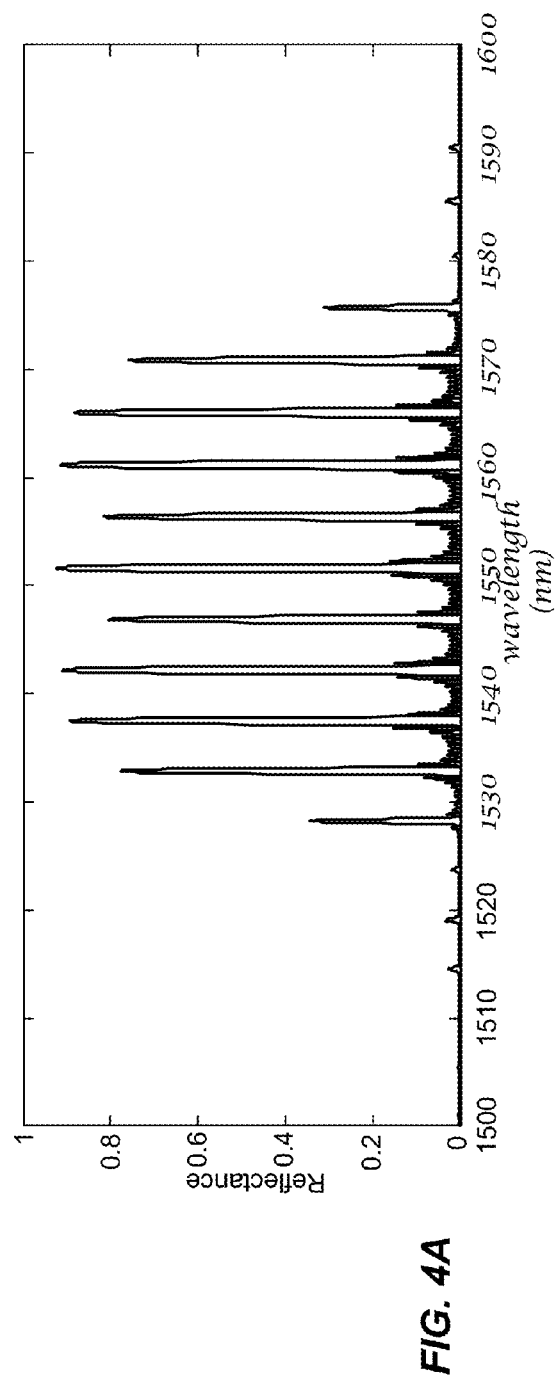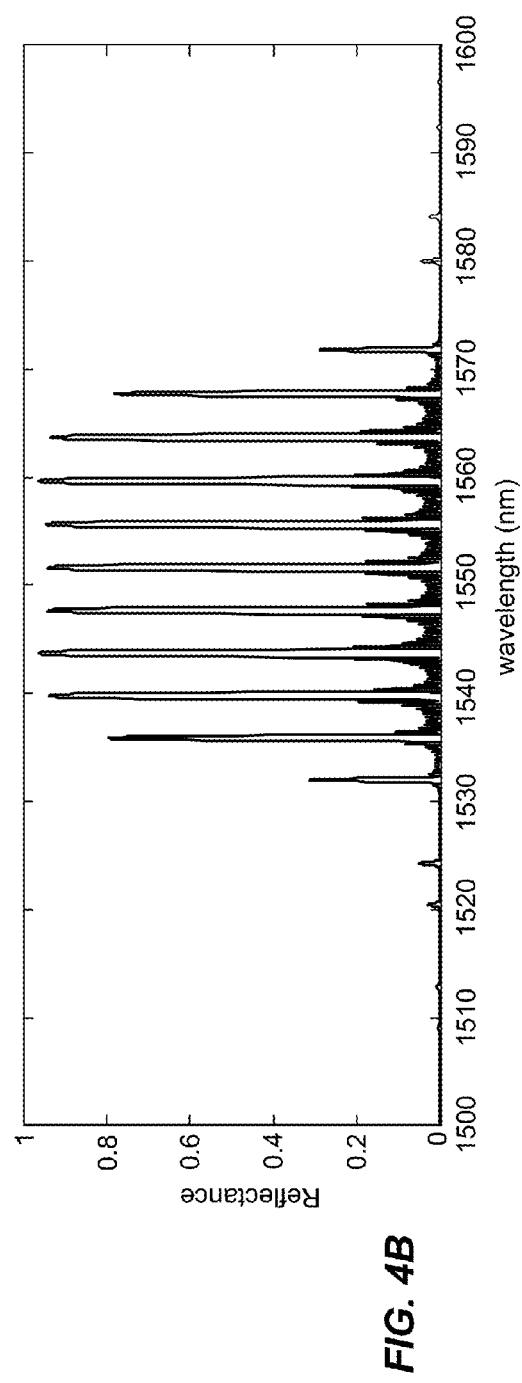
FIG. 4A
FIG. 4B

TUNABLE HYBRID LASER WITH CARRIER-INDUCED PHASE CONTROL

CROSS-REFERENCES TO RELATED APPLICATIONS

This application claims priority to U.S. Provisional Patent Application No. 61/532,050, filed on Sep. 7, 2011, entitled "Tunable Hybrid Laser with Carrier-Induced Phase Control," the disclosure of which is hereby incorporated by reference in its entirety for all purposes.

BACKGROUND OF THE INVENTION

Advanced electronic functions such as photonic device bias control, modulation, amplification, data serialization and de-serialization, framing, routing, and other functions are typically deployed on silicon integrated circuits. A key reason for this is the presence of a global infrastructure for the design and fabrication of silicon integrated circuits that enables the production of devices having very advanced functions and performance at market-enabling costs. Silicon has not been useful for light emission or optical amplification due to its indirect energy bandgap. This deficiency has prevented the fabrication of monolithically integrated opto-electronic integrated circuits on silicon.

Compound semiconductors such as indium phosphide, gallium arsenide, and related ternary and quaternary materials have been extremely important for optical communications, and in particular light emitting devices and photodiodes because of their direct energy bandgap. At the same time, integration of advanced electrical functions on these materials has been limited to niche, high-performance applications due to the much higher cost of fabricating devices and circuits in these materials.

Thus, there is a need in the art for improved methods and systems related to composite integration of silicon and compound semiconductor devices.

SUMMARY OF THE INVENTION

Embodiments of the present invention relate to hybrid-integrated silicon photonics. More particularly, embodiments of the present invention relate to an apparatus and method of hybrid integration of compound semiconductor chips with tuning elements monolithically integrated onto a silicon base and the like.

According to an embodiment of the present invention, a tunable laser is provided. The tunable laser includes a substrate comprising a silicon material, a gain medium coupled to the substrate, wherein the gain medium includes a compound semiconductor material, and a waveguide disposed in the substrate and optically coupled to the gain medium. The tunable laser also includes a first wavelength selective element characterized by a first reflectance spectrum and disposed in the substrate, a carrier-based phase modulator optically coupled to the first wavelength selective element, and a second wavelength selective element characterized by a second reflectance spectrum and disposed in the substrate. The tunable laser further includes an optical coupler disposed in the substrate and optically coupled to the first wavelength selective element, the second wavelength selective element, and the waveguide, and an output mirror.

According to another embodiment of the present invention, a method of operating a tunable laser is provided. The method includes providing a hybrid resonator cavity including a gain material and a waveguide structure coupled to the gain material, transmitting light through the waveguide structure, and splitting the waveguide structure into a set of reflection legs. The method also includes directing a portion of the light in the waveguide structure to propagate through a first phase control device, directing a second portion of the light in the waveguide structure to propagate through a second phase control device, and adjusting a phase in at least one of the first phase control device or the second phase control device. The method further includes reflecting light passing through the first phase control device, reflecting light passing through the second phase control device, and recombining light reflected from the set of reflection legs.

Numerous benefits are achieved by way of the present invention over conventional techniques. For example, embodiments of the present invention provide methods and systems suitable for reducing the size and power consumption of optical communications systems, relaxing the requirements for stringent temperature control of the devices. Embodiments of the present invention integrate carrier-based control (e.g., a p-n junction or a p-i-n junction in two examples) with opto-electronic elements to provide for tuning and modulation of a laser output. These and other embodiments of the invention along with many of its advantages and features are described in more detail in conjunction with the text below and attached figures.

BRIEF DESCRIPTION OF THE DRAWINGS

FIG. 3A is a simplified perspective view of a waveguide according to an embodiment of the present invention;

FIG. 3B is a simplified cross-sectional view at a high index portion of the waveguide illustrated in FIG. 3A according to an embodiment of the present invention;

FIG. 3C is a simplified cross-sectional view at a low index portion of the waveguide illustrated in FIG. 3A according to an embodiment of the present invention;

FIG. 4A illustrates a reflectance spectrum for a first modulated grating reflector according to an embodiment of the present invention;

FIG. 4B illustrates a reflectance spectrum for a second modulated grating reflector according to an embodiment of the present invention;

DETAILED DESCRIPTION OF THE INVENTION

Figure 1A:
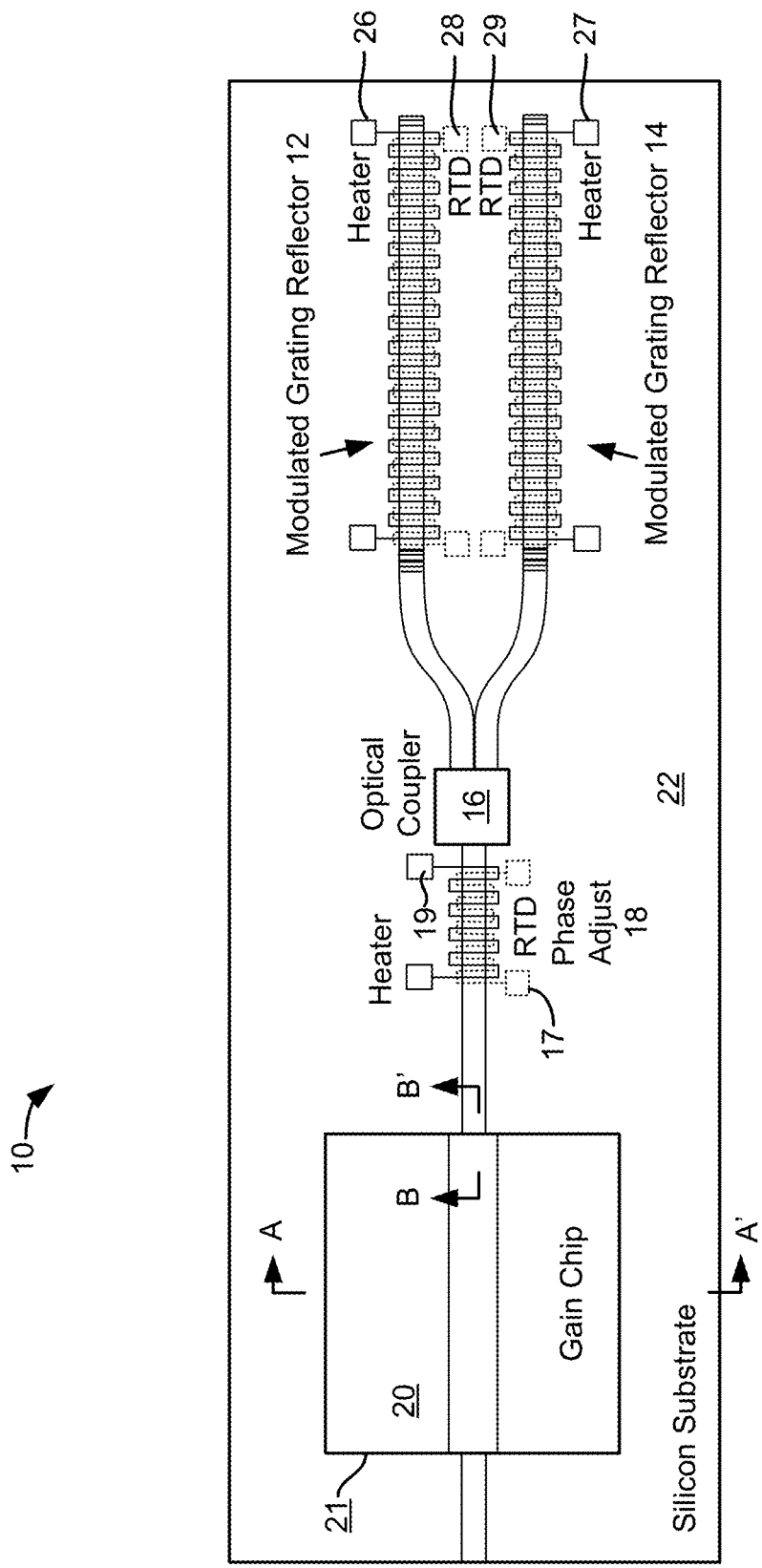
FIG. 1A is a simplified plan view illustrating a hybrid integrated tunable laser according to an embodiment of the present invention.

Hybrid integration on silicon is preferable for the commercial deployment of optoelectronic integrated circuits. Silicon is a preferable material for electronic integration. Silicon technology has advanced such that extremely complex electronic functions can be realized very inexpensively. Silicon is also a good material for constructing low loss optical waveguides. However, monolithic integration of light generating or detecting functions has been prevented in silicon because it is an indirect bandgap material. Conversely, compound semiconductor materials, including III-V materials such as indium phosphide are well suited for light generation and detection because of their physical properties such as being direct bandgap materials. These materials are complex material systems with small substrates and relatively (compared to silicon) low yields. As such, constructing devices with a high level of functionality is currently cost prohibitive.

Embodiments of the present invention relate to an apparatus and method for hybrid integration of compound semiconductor devices with tuning elements monolithically integrated onto a silicon base or similar material. Preferably, hybrid integration is the method to overcome the specific deficiencies of silicon and compound semiconductors while capitalizing on their respective strengths. Embodiments of the present invention preferably utilize the complex electronic functionality available in silicon devices to minimize cost, and the optical functions (e.g., light generation and detection) available in III-V materials to form hybrid integrated systems. Some embodiments of the present invention remove functionality from the III-V material system and transfer such functionality to the silicon system to improve system performance.

Embodiments of the present invention utilize photonic apparatus fabricated using compound semiconductor material systems that are mounted onto silicon integrated circuit platforms and the like. Embodiments of the present invention achieve photonic integration by utilizing a plurality of techniques and apparatus that do not historically rely on a direct energy bandgap, including, but not limited to, waveguides, optical multiplexers, optical demultiplexers, optical modulators, and the like, that can be fabricated using silicon and similar materials. Embodiments of the present invention optionally include, but are not limited to, methods of modifying the refractive index of silicon via current injection or local heating.

Embodiments of the present invention include, but are not limited to, optionally utilizing the laser devices that serve as the initial source of optical energy. In today's dense wavelength division multiplexing ("DWDM") systems, the laser sources are typically fixed-wavelength distributed feedback lasers or tunable lasers. Tunable lasers preferably provide additional flexibility to the optical communications network operators. Some DWDM systems can use lasers with up to 80 different wavelengths. A single tunable laser is capable of tuning to any of those wavelengths. One tunable laser can be inventoried and used to replace any of 80 fixed wavelength lasers, thereby reducing the required inventory levels and the associated costs.

The term "silicon" as used throughout this application includes but is not limited to tetravalent nonmetallic elements and the like. The term "laser" as used throughout the specification includes but is not limited to an acronym for light amplification by stimulated emission of radiation; and/or an optical device that produces an intense monochromatic beam of coherent light. The term "SOI" and/or "Silicon on Insulator" stands for, a type of substrate material as used throughout this specification includes but is not limited to grating and tuning testing. The term "DWDM" and/or "Dense Wavelength Division Multiplexing" as used throughout this application includes but is not limited to a technique utilized by the optical communications industry to maximize system bandwidth while minimizing capital expenditures and operational expenditures. These costs are minimized through the use of DWDM techniques because the system operators can increase their system bandwidth simply by adding another optical wavelength as opposed to needing to deploy additional optical fibers which usually requires significant expense. The term "bandgap" as used throughout this application includes but is not limited to an energy range in a solid where no electron states exist; and/or the energy difference between the top of the valence band and the bottom of the conduction band; and/or the amount of energy required to free an outer shell electron from its orbit about the nucleus to a free state; and/or any combination thereof. The term "photonic integration" as used throughout this application includes but is not limited to the meaning to make into a whole or make part of a whole multiple functions and reduce packaging size by an order of magnitude, for example, while matching the performance of a subsystem built with discrete components. The term "gain media" and interchangeably "gain chip" as used throughout this application includes but is not limited to the source of optical gain within a laser. The gain generally results from the stimulated emission of electronic or molecular transitions to a lower energy state from a higher energy state. The term "InP" or "Indium Phosphide", as used throughout this application is used interchangeably with the phrase "III-V compound semiconductor".

FIG. 1A is a simplified plan view illustrating a hybrid integrated tunable laser according to an embodiment of the present invention. As illustrated in FIG. 1A, laser 10 is a hybrid integrated structure including both active and passive elements disposed on or fabricated in a silicon substrate 22. Although a silicon substrate 22 is illustrated, this is intended to include a variety of semiconductor devices fabricated using the silicon material system. Such devices include CMOS circuitry, current sources, laser drivers, thermal system controllers, passive optical elements, active optical elements, and the like.

Referring to FIG. 1A, a first modulated grating reflector 12 and a second modulated grating reflector 14 are fabricated on the silicon substrate 22. Modulated grating reflectors 12 and 14 are preferably modifiable to adjust the refractive index. The first modulated grating reflector 12 and the second modulated grating reflector 14 are examples of wavelength selective elements that are utilized according to embodiments of the present invention. The illustration of the use of modulated grating reflectors in FIG. 1A is not intended to limit the scope of the present invention but merely to provide examples of wavelength selective elements. Other wavelength selective elements can be utilized in embodiments of the present invention. As described more fully below, the wavelength selective elements can be sampled Bragg gratings or sampled distributed feedback reflectors that provide a comb of reflectance peaks having a variable comb spacing over a tunable wavelength range. Embodiments of the present invention are not limited to these implementations and photonic crystals, etalon structures, MEMS devices, ring resonators, arrayed-waveguide grating devices, Mach-Zehnder lattice filters, and the like can be employed as wavelength selective elements. A benefit provided by the wavelength selective elements discussed herein is a reflection spectra including a single or multiple peaks that can be shifted through the use of a controllable parameter such as current, voltage, temperature, mechanical force, or the like.

As an example, heaters integrated into the silicon substrate can be utilized to locally change the temperature of the region surrounding the modulated grating reflectors and thereby, the index of refraction. As described more fully below, the ability to control the local index of refraction provides the functionality of varying the reflectivity of the modulated grating reflectors and the output wavelength of the hybrid integrated device.

Laser 10 further includes, but is not limited to, multimode interference coupler 16 and one or multiple phase adjustment sections 18. The phase adjustment section 18 can also be referred to as a phase control region that provides for correction of phase misalignment between the output of the coupler section, which may be implemented through wavelength selective devices (e.g., the grating sections) and the gain media 20. In the illustrated embodiment, the phase adjustment section 18 is positioned between the multimode interference coupler 16 and the gain media 20, however, other embodiments locate this element in different locations providing the same or similar performance characteristics.

The coupler section, which may be implemented through the use of a multimode interference coupler, y-branch, or other method, splits and recombines light from two or more tuning sections. The multimode interference coupler, which is based upon the principle that coherent light launched from a waveguide (input waveguide) into a propagation section will self image at periodic intervals, can be used to efficiently achieve n×m splitting ratios. In this instance, the design is optimized for a 1×2 split but other splitting ratios may be employed in the case where there are either multiple gain chips or more than 2 tuning arms. An advantage provided by the illustrated device is that coherent light returning from the tuning arms, where the phase relationship of the light is fixed, can be coupled back into the launch waveguide with minimal excess loss. In order to ensure that the interference pattern of the returning light has maximum overlap with the input waveguide, a phase adjustment section may be implemented in one or more of the branch arms. In addition to phase adjustment in the branch arms, a phase adjustment section 18 is utilized in the waveguide section leading from the coupler 16 to the gain chip 20. This phase adjustment section, which can be implemented through a device such as a heater or current injection electrode, which changes the refractive index in the waveguide layer under the device, serves to provide an overlap between the cavity modes of the device and the grating mode selected by tuning section.

As illustrated in FIG. 1A, gain media 20 (also referred to as a gain chip) fabricated using a compound semiconductor material system is integrated with the silicon substrate 22 in a hybrid configuration. The compound semiconductor material, which is direct bandgap, provides optical gain for the laser device. The hybrid integration or attachment of the gain media (and/or other compound semiconductor elements) to the silicon substrate can be provided in one or several manners. In a particular embodiment, the hybrid integration is performed using the methods and systems described in the related application reference in paragraph [0002]. In addition to gain media, absorptive media fabricated using compound semiconductor materials can be integrated with the silicon substrate. Embodiments of the present invention integrate III-V devices and structures acting as gain and/or absorption regions with silicon photonics elements in which optical and/or electrical functionality is provided. The silicon photonic elements may include CMOS circuitry and the like. One of ordinary skill in the art would recognize many variations, modifications, and alternatives.

Figure 4C:
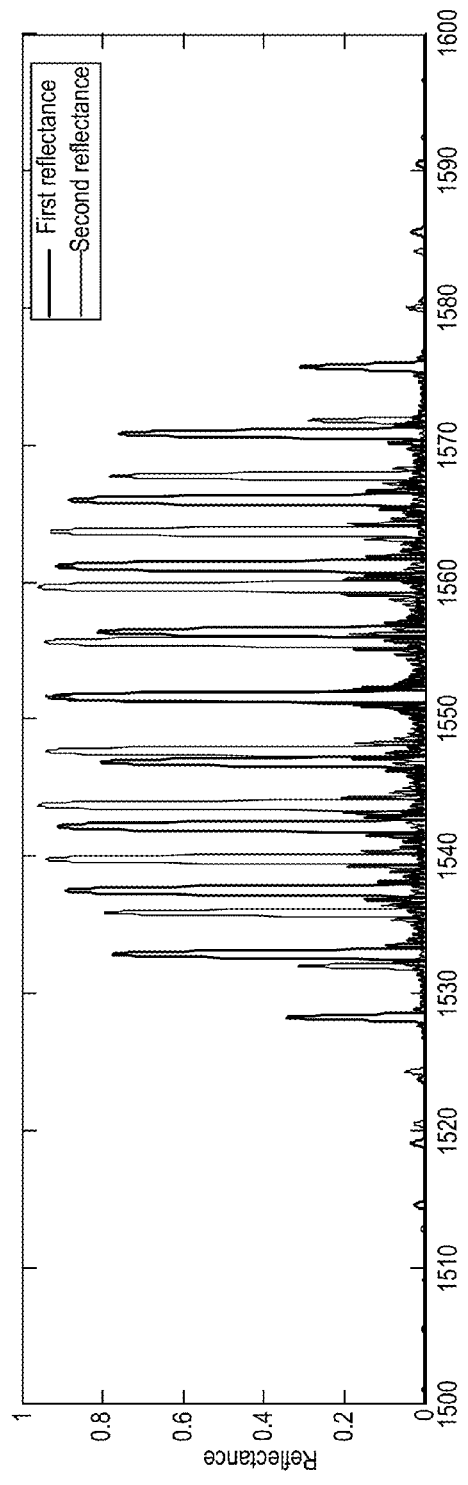
FIG. 4C illustrates an overlay of the reflectance spectra shown in FIG. 4A and FIG. 4B.
Figure 4D:
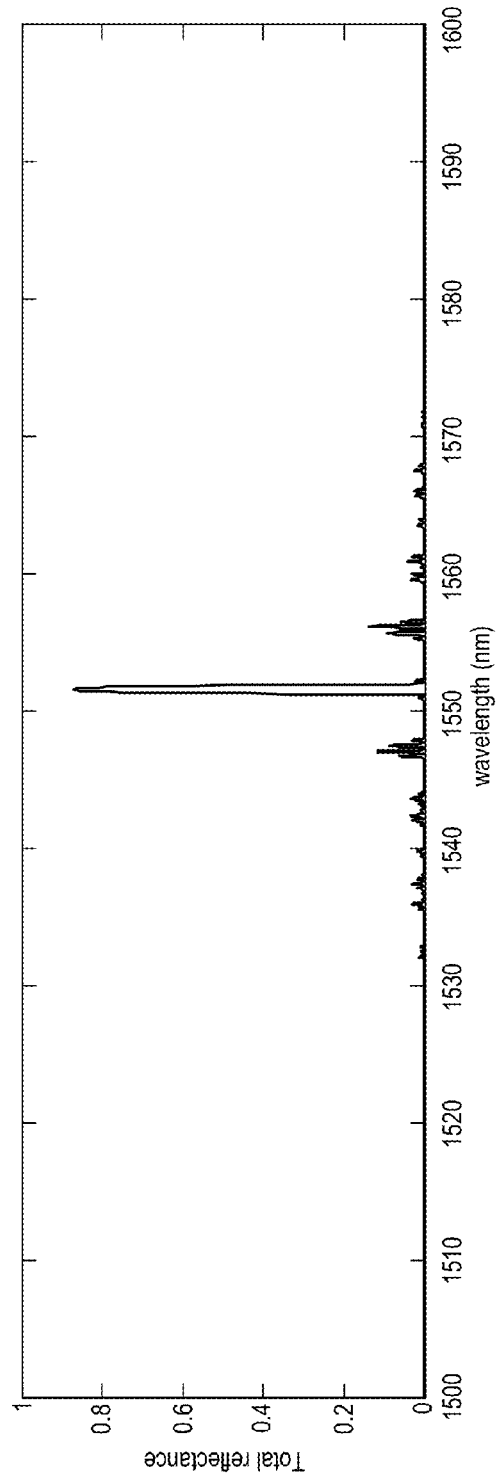
FIG. 4D illustrates constructive interference between the reflectance spectra shown in FIG. 4A and FIG. 4B.

As discussed in more detail in relation to FIGS. 4-4D, modulated grating reflectors 12 and 14 provide feedback at one end of the laser 10. Feedback in the form of a front facet reflector is provided by a low reflectance coating (e.g., a dielectric coating with a reflectance of a few percent, for example, ~1-10%) applied to the gain media on surface 21. Alternatively, a distributed feedback (e.g., a grating) structure could be integrated into the silicon substrate to provide feedback for the laser cavity. In another embodiment, a low reflectance coating is applied to a surface of the silicon substrate. One of ordinary skill in the art would recognize many variations, modifications, and alternatives. As illustrated in FIG. 1A, optical functionality other than optical gain has been transferred from the III-V materials in which it is typically located and integrated into the silicon materials, thereby increasing device yield in comparison with designs that are fully integrated in III-V materials. In the illustrated embodiment, the tunable reflective sections (also referred to as wavelength selective devices) and other optical functions are performed in the silicon material.

FIG. 1A also illustrates heater element 26 and temperature sensor 28 associated with first modulated grating reflector 12 and heater element 27 and temperature sensor 29 associated with the second modulated grating reflector. In an embodiment, the heater element can be a thin film resistor formed through the vacuum deposition of a material such as W, NiCr, TaN, WSi, $RuO_2$, PbO, $Bi_2Ru_2O_7$, $Bi_2Ir_2O_7$, or the like.

In an embodiment, the temperature sensor can be a resistive thermal device (RTD), a thermocouple, a p-n junction, or the like. By flowing a current through the heaters, the temperature of the region surrounding the modulated grating reflectors can be modified in order to modify the index of refraction and the reflectance profile as a result. Phase adjustment section 18, which also may use the temperature dependence of the refractive index to control the effective optical length and thereby the phase of light, is also provided with a heater and a temperature sensor to provide similar functionality and wavelength tunability.

Some embodiments of the present invention utilize thermal tuning to achieve index of refraction changes in the silicon-based modulated grating reflectors. One of the benefits available using thermal tuning is a significant reduction in the short time scale variations in index of refraction that are produced using thermal tuning in comparison to these variations achieved using current tuning in InP material system. Such improvement in refractive index stability will result in a laser linewidth significantly narrower than can be achieved using other approaches. As will be evident to one of skill in the art, the stable tuning provided by embodiments of the present invention enables use of the lasers described herein in DWDM applications and other applications utilizing precisely tuned lasers. As an example, advanced modulation techniques such as DQPSK can benefit from use of the lasers described herein.

The phase adjustment section operates through the modification of the refractive index of the waveguide section contained therein. Through modification of the refractive index, the phase angle of the light exiting the phase adjustment device relative the input phase angle can be precisely controlled. This allows the alignment of laser cavity modes with grating modes. In the illustrated embodiment, the phase adjustment device 18 includes a heater 19 and a temperature sensor (e.g., an RTD) 17.

Figure 1B:
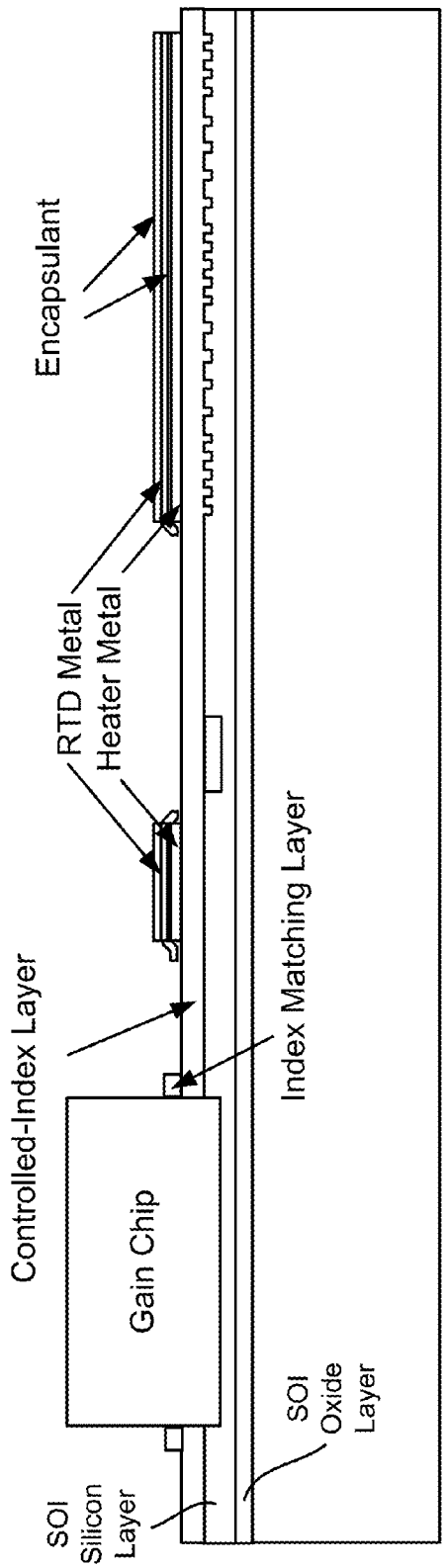
FIG. 1B is a simplified cross-sectional view illustrating a hybrid integrated tunable laser according to a particular embodiment of the present invention.

FIG. 1B is a simplified cross-sectional view illustrating a hybrid integrated tunable laser according to a particular embodiment of the present invention. As illustrated in FIG. 1B, direct coupling between the waveguide in the gain media and the waveguide in the silicon layer is utilized. The heater element and the temperature sensor (e.g., an RTD) are illustrated for the phase adjustment section as well as the modulated grating reflector sections. An encapsulant is illustrated over the modulated grating reflector sections. The encapsulant provides for electrical isolation among other features.

Figure 1C:
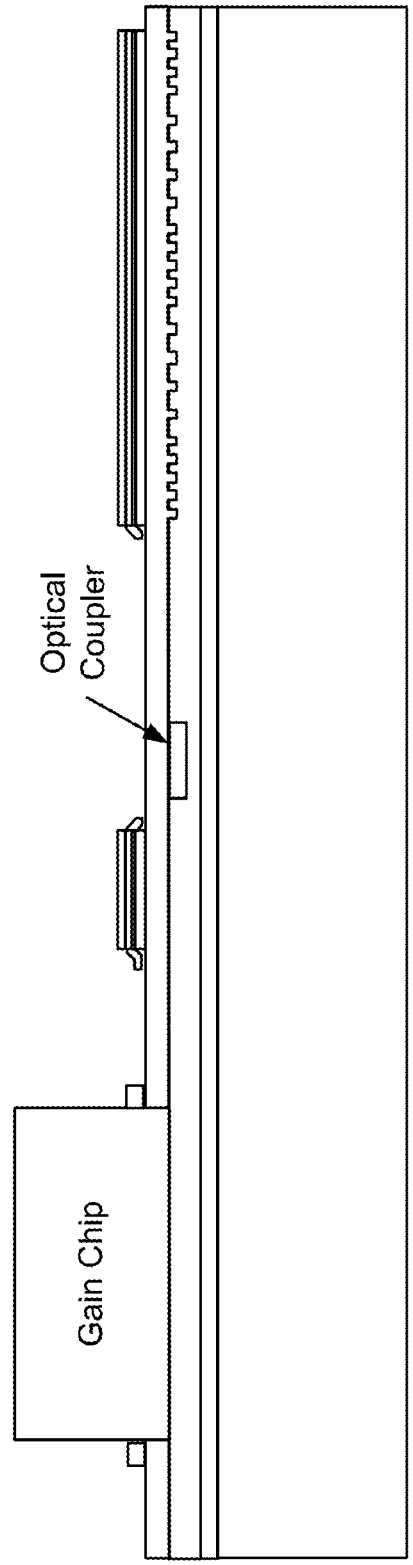
FIG. 1C is a simplified cross-sectional view illustrating a hybrid integrated tunable laser according to a specific embodiment of the present invention.

FIG. 1C is a simplified cross-sectional view illustrating a hybrid integrated tunable laser according to a specific embodiment of the present invention. The structure illustrated in FIG. 1C is similar to that illustrated in FIG. 1B except that evanescent coupling between the waveguide in the gain media and the waveguide in the silicon layer is utilized.

Figure 2A:
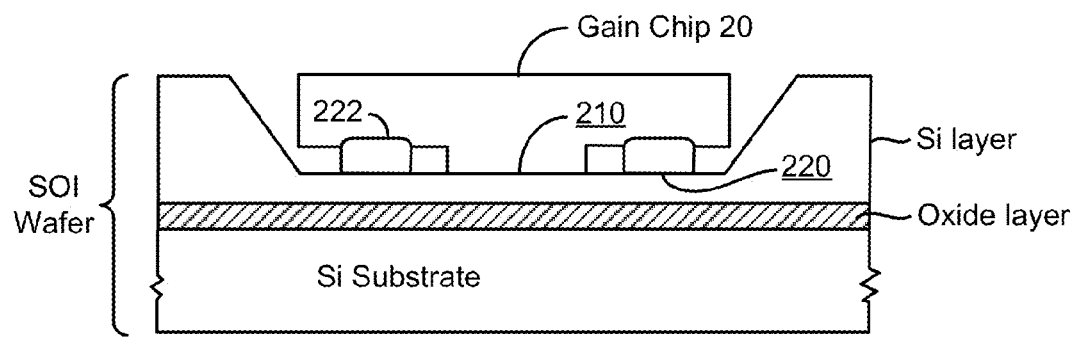
FIG. 2A is a cross-sectional view at cross section A-A' as illustrated in FIG. 1A.
Figure 2B:
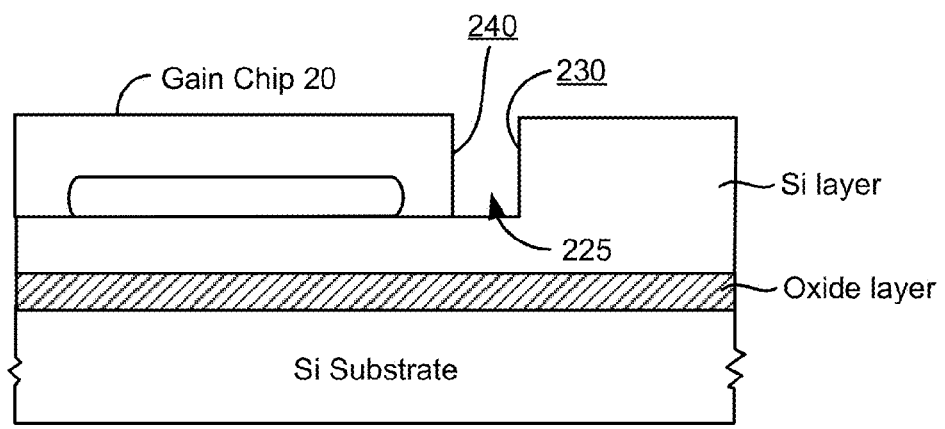
FIG. 2B is a cross-sectional view at cross section B-B' as illustrated in FIG. 1A.

Referring to FIG. 1B, a Controlled Index Layer is illustrated that is not necessarily the same as the index matching layer illustrated in FIG. 2B. The controlled index layer can be used for mode shaping in the silicon waveguide, for example, by using air, $SiO_2$ or the like. According to some embodiments of the present invention, a higher index material is utilized to broaden the mode in the silicon waveguide such that optical coupling to the gain media is improved. If the controlled index layer is not an insulator, an encapsulant layer may also be used between the heater metal and controlled index layer. As illustrated in FIGS. 1B and 1C, either direct coupling (also known as butt coupling) or evanescent coupling of the gain media to the silicon waveguide may be used.

Referring to FIG. 1C, the optical coupler, which may be a device such as a MMI (multimode interference coupler) is illustrated. In some embodiments, an MMI can be formed using an unguided propagation region. Additionally, although not illustrated in FIGS. 1A-1C, a second phase adjust region may be provided in one of the legs of the Y-branched structure in addition to the phase adjustment section illustrated at the output of the tuning section.

FIG. 2A is a cross-sectional view at cross section A-A' as illustrated in FIG. 1A. The silicon substrate 22 is illustrated as well as a silicon-on-insulator (SOI) oxide layer 23 and an SOI silicon layer 24. In the embodiment shown, a portion of the SOI silicon layer has been removed using an etching or other process to provide a recessed region into which the gain chip has been inserted. Such etching may not be performed in the case where evanescent coupling of the light from the gain chip into the silicon waveguide is used. The gain chip is bonded to the silicon substrate in the embodiment illustrated in FIG. 2A using a metal/metal structural bond at locations 25 that provide an electrical bond between the hybrid elements. Additionally, a metal/semiconductor or a semiconductor/semiconductor bond is illustrated. Combinations of these bonding techniques can be implemented as well. One of ordinary skill in the art would recognize many variations, modifications, and alternatives.

FIG. 2B is a cross-sectional view at cross section B-B' as illustrated in FIG. 1A. As will be evident to one of skill in the art, the optical waveguide in the gain chip will be coupled to an optical waveguide in the SOI silicon layer. An index matching region is provided at the interface between the gain chip and the SOI silicon layer to facilitate a high degree of optical coupling between the hybrid devices and to reduce or minimize parasitic reflections. The index matching region can be filled with an appropriate index matching material, remain empty, have optical coatings applied to the surfaces of the hybrid devices as illustrated at facets 26 and/or 27, combinations thereof, or the like.

Referring once again to FIG. 1A first modulated grating reflector 12 provides optical feedback creating a comb of reflected optical wavelengths. Second modulated grating reflector 14 provides optical feedback characterized by a different optical period, thereby resulting in a variable set of reflected wavelengths. The two combs of wavelengths are combined in optical coupler 16. The combs overlap and lasing preferably occurs due to constructive interference. Optionally, where the combs do not overlap, lasing is preferably prevented due to destructive interference. Specific optical spectra of first modulated grating reflector 12 and/or second modulated grating reflector 14 can be modified by varying the refractive index. The refractive index is preferably modified by varying the temperature of the modulated grating reflectors 12, 14 using a heating element. The amount of heating is optionally monitored through use of an RTD element.

Phase adjustment is provided using phase adjustment region 18 to compensate for small phase offsets between the reflection spectra from first modulated grating reflector 12 and the second modulated grating reflector 14. Embodiments of the present invention comprise functional blocks that can be realized in a compound semiconductor such as indium phosphide, and/or silicon and/or similar material. Embodiments of the present invention comprise tuning by modifying the refractive index of the silicon and the like, preferably using a thermal technique.

In embodiments of the present invention, the gain media, which preferably uses a direct-bandgap material, can be realized in a compound semiconductor material. Other embodiments of the present invention include functional blocks that can be realized in silicon material systems. Embodiments of the present invention utilize a hybrid-approach that is preferable for a variety of reasons that include, but are not limited to: manufacturing components using methods that can result in high-yields at low cost; virtually unlimited levels of additional integration can be achieved because of the complexity of the III-V material system as compared to the Si material system, and the like. Therefore, embodiments of the present invention encompass substantially all necessary circuits to control the operation of the tunable laser and can also be monolithically integrated with silicon-based devices.

It should be noted that while embodiments of the present invention have been implemented in relation to products produced by the semiconductor industry, embodiments of the present invention are also useful in optical communications networks for the telecommunications industry, the enterprise communications industry, high-performance computing interconnects, back-plane optical interconnects, chip-to-chip optical interconnects, intra-chip optical interconnects, and the like. In addition to these communication applications, embodiments of the present invention also have applications in the medical device industry.

The following figures illustrate an analysis and applications of waveguides created in silicon using an SOI substrate with a silicon dioxide cap layer. This material system is merely described by way of example and embodiments of the present invention can be implemented in other material systems.

FIG. 3A is a simplified perspective view of a waveguide according to an embodiment of the present invention. As illustrated in FIG. 3A, a waveguide structure is formed with a periodic variation in thickness of one or more layers making up the waveguide. In the illustrated embodiment, the SOI silicon layer varies in thickness with a high portion having thickness H and a low portion having thickness H-h. The width of the waveguide is W. For purposes of clarity, only the top two SOI layers (i.e., the SOI oxide layer and the SOI silicon layer) are illustrated in FIGS. 3A-3C. FIG. 3B is a simplified cross-sectional view at a high index portion of the waveguide illustrated in FIG. 3A according to an embodiment of the present invention. FIG. 3C is a simplified cross-sectional view at a low index portion of the waveguide illustrated in FIG. 3A according to an embodiment of the present invention. It should be noted that the top $SiO_2$ layer shown in these figures may be replaced by another index-controlled layer such as air, $TiO_2$, SiC, ZnS, $Nb_2O_5$, $HfO_2$, $ZrO_2$. As will be evident to one of skill in the art, the indexes of the various materials will impact the shape of the optical modes.

The waveguide structure was analyzed to determine an effective index for the various sections of the waveguide. A vector EM mode solver was used and applied to two different single mode ridge waveguides with two different ridge heights. The effective indices $n_H$ and $n_L$ and mode profiles could be extracted, then the full three-dimensional problem was a one-dimensional problem, with the one-dimensional transfer matrix method efficiently simulating the multi-layer structures. The index difference created reflections that accumulated coherently over the length result in differing reflectances versus wavelength.

Figure 3D:
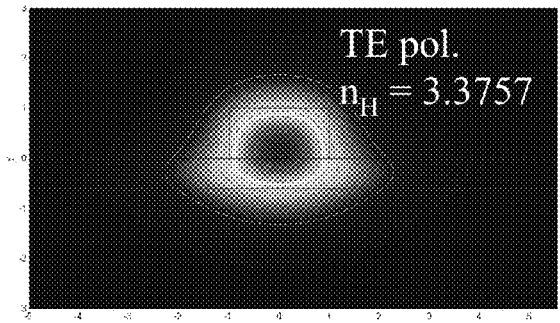
FIG. 3D is a contour plot illustrating a TE mode for the high index portion of the waveguide illustrated in FIG. 3B.
Figure 3E:
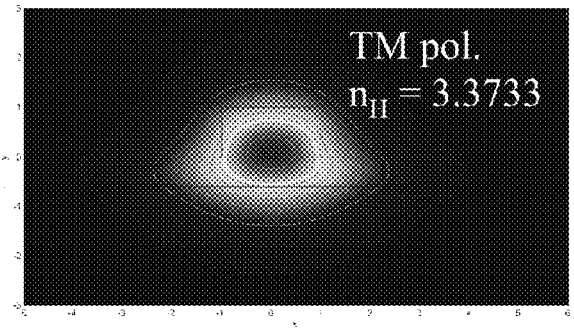
FIG. 3E is a contour plot illustrating a TM mode for the high index portion of the waveguide illustrated in FIG. 3B.
Figure 3F:
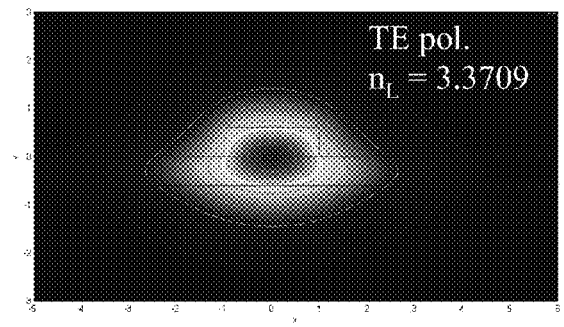
FIG. 3F is a contour plot illustrating a TE mode for the low index portion of the waveguide illustrated in FIG. 3C.
Figure 3G:
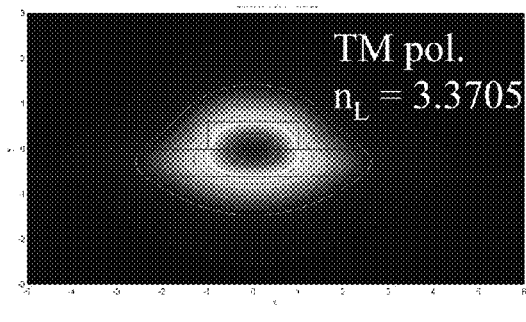
FIG. 3G is a contour plot illustrating a TM mode for the low index portion of the waveguide illustrated in FIG. 3C.

FIG. 3D is a contour plot illustrating a TE mode for the high index portion of the waveguide illustrated in FIG. 3B. FIG. 3E is a contour plot illustrating a TM mode for the high index portion of the waveguide illustrated in FIG. 3B. FIG. 3F is a contour plot illustrating a TE mode for the low index portion of the waveguide illustrated in FIG. 3C. FIG. 3G is a contour plot illustrating a TM mode for the low index portion of the waveguide illustrated in FIG. 3C.

FIG. 4A illustrates a reflectance spectrum for a first modulated grating reflector according to an embodiment of the present invention and FIG. 4B illustrates a reflectance spectrum for a second modulated grating reflector according to an embodiment of the present invention. As illustrated in FIG. 4A, the grating structure includes a superstructure grating (SSG) in which periodically modulated gratings provide a comb-like reflection spectrum. In these gratings, multiple elements of periodicity are provided such that the mode spacing associated with the grating is overlaid with an envelope. The spacing between the modes of the comb will be a function of the height and other features of the grating features formed in the waveguide.

As an example of an SSG, the reflectance spectrum illustrated in FIG. 4A was obtained using the following 3-step modulated superstructure grating parameters:
Duty cycles=[0.5 0.5 0.5]
Periods=[227.7 230 232.3] nm
$N_{sub}$=[110 109 108]
$\Lambda_s$=(25.047+25.07+25.088)=75.205 μm
$n_H$=3.3757; $n_L$=3.3709;
$\Delta n = n_H - n_L$=0.0048
$N_p$=11
Total number of periods=3597 mixed periods
For these grating parameters, a mode spacing of $\Delta\lambda_1$=4.7 nm was achieved.

As another example of a SSG, the reflectance spectrum illustrated in FIG. 4B was obtained using the following 3-step modulated superstructure grating parameters:
Duty cycles=[0.5 0.5 0.5]
Periods=[228.2 230 231.8] nm
$N_{sub}$=[131 130 129]
$\Lambda s$=(29.894+29.9+29.902)=89.696 μm
$n_H$=3.3757; $n_L$=3.3709;
$\Delta n = n_H - n_L$=0.0048
N=11
Total number of periods=4290 mixed periods
For these grating parameters, a mode spacing of $\Delta\lambda_2$=4.0 nm was achieved.

FIG. 4C illustrates an overlay of the reflectance spectra shown in FIG. 4A and FIG. 4B. FIG. 4D illustrates constructive interference between the reflectance spectra shown in FIG. 4A and FIG. 4B. The first and second modulated grating reflectors are designed to provide different peak spacings such that only a single peak is aligned. Thus, only one cavity mode is selected for lasing. As described below, the single peak can be widely tuned over wavelength space based on thermal effect, free carrier injection, or the like. Although embodiments of the present invention are illustrated in relation to operation and tunability around 1550 nm, other wavelengths are available using appropriate semiconductor laser materials.

Thus, implementations of the silicon hybrid tunable laser of the present invention was capable of tuning over the substantially entire wavelength range of interest. Tuning can be achieved, as described more fully below using several techniques including thermal tuning Referring once again to FIGS. 4A and 4B, the illustrated embodiment is operable over a range of temperatures including 40° C. Tuning of the laser wavelength can be considered as follows: the comb of wavelengths illustrated in FIG. 4A is created by the first modulated grating reflector 12 illustrated in FIG. 1A. The comb of wavelengths illustrated in FIG. 4B is created by the second modulated grating reflector 14 illustrated in FIG. 4B. The overlay of the first comb and the second comb is illustrated in FIG. 4C and demonstrates the combination of the wavelengths obtained from the first modulated grating reflector 12 and the second modulated grating reflector 14. The constructive interference between the two wavelength combs is illustrated in FIG. 4D, with substantially a single peak in the reflectance profile. The one strong reflection peak thus produces the single laser mode, which is the only mode supported by the combined reflectances. In an embodiment, the spectrum illustrated in FIG. 4D will be present as the output of the optical coupler 16 provided to the phase adjustment section 18.

Figure 5A:
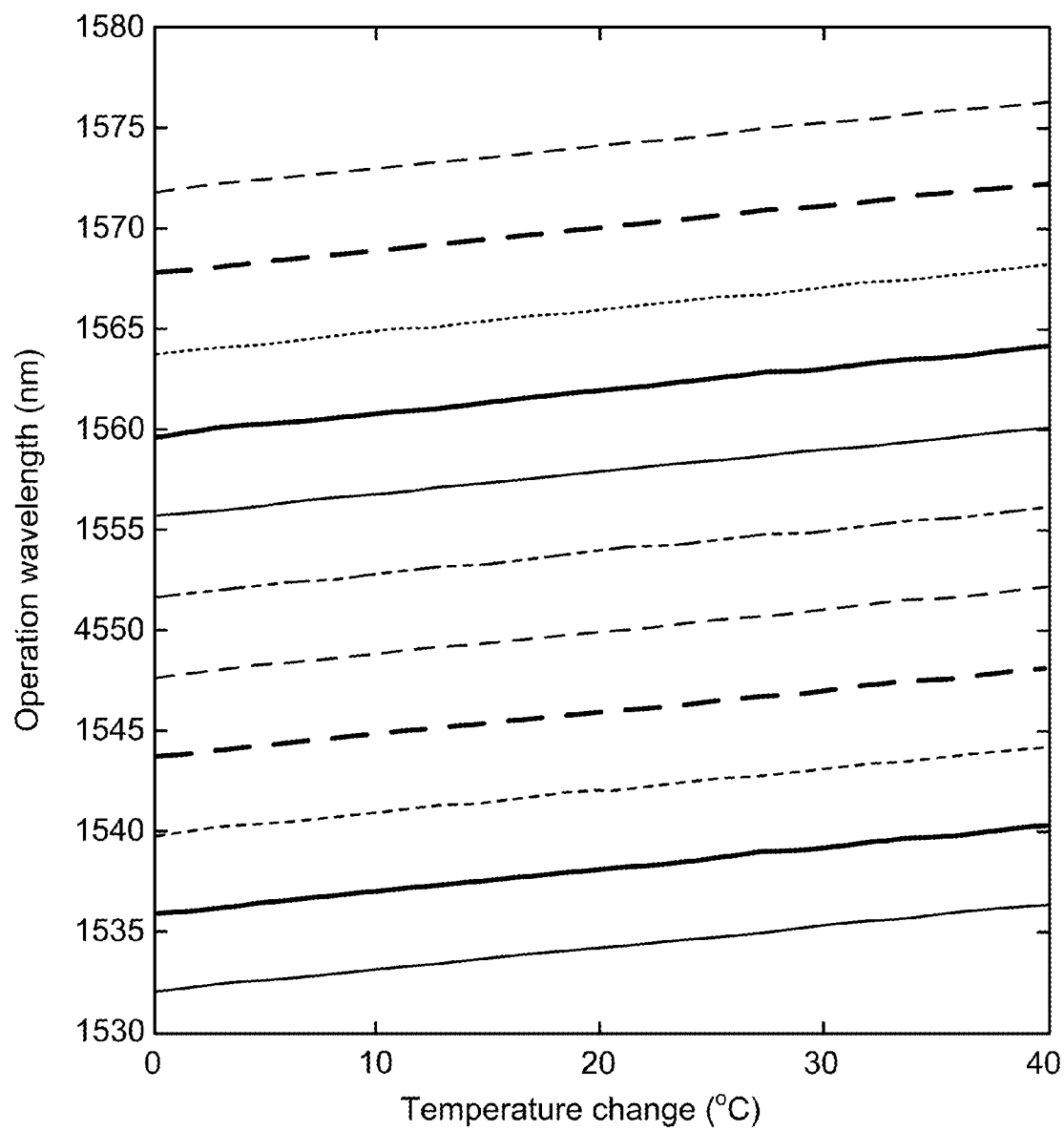
FIG. 5A is a plot illustrating operating wavelength as a function of temperature change according to an embodiment of the present invention.

FIG. 5A is a plot illustrating operating wavelength as a function of temperature change according to an embodiment of the present invention. As illustrated in FIG. 5A, the operating wavelength shifts as a function of temperature in a substantially linear manner. As will be evident to one of skill in the art, the shift in wavelength of the reflection peak as a function of temperature (and index of refraction) results in the shift in operating wavelength.

Figure 5B:
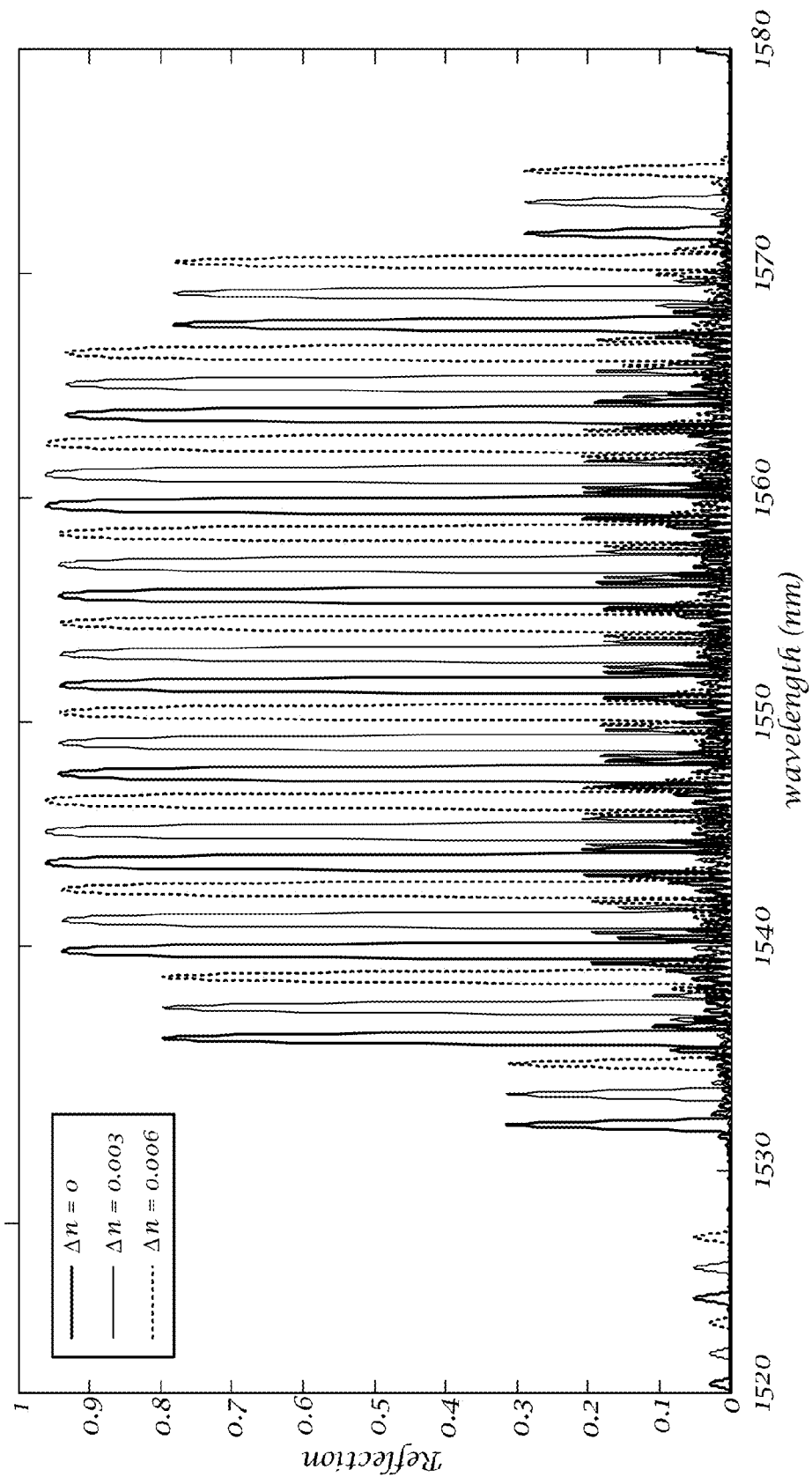
FIG. 5B illustrates wavelength shifting of a reflectance spectrum as a function of index of refraction according to an embodiment of the present invention.

FIG. 5B illustrates wavelength shifting of a reflectance spectrum as a function of index of refraction according to an embodiment of the present invention. For a nominal index ($\Delta n=0$), the peaks of the comb are located at a first set of wavelengths. As the index of refraction is shifted, for example, by thermal tuning, the comb shifts to a new set of wavelengths as illustrated by the combs associated with $\Delta n=0.003$ and $\Delta n=0.006$. Thus, embodiments of the present invention provide for tunability of silicon photonics in which tuning is accomplished using the thermo optic (TO) effect of silicon. The TO coefficient of silicon is approximately $$C_{TO}=2.4\times10^4 K^{-1}$$

over the temperature range up to 650° C. In the embodiments described herein, a conventional silicon ridge waveguide was used for waveguiding so that the TO is considered to be in the same range as the value given above. The index of refraction due to the TO effect can be expressed as:

$$\Delta n = C_{TO}\Delta T.$$

Thus, for a temperate change of about 40° C., a change in the index of refraction of about 0.0096 can be provided for silicon material. As illustrated in FIG. 5B, this translates to a change of about 4 nm in laser wavelength change. It should be noted that the dynamic tuning range for each mode can be adjusted by increasing the number of super-periods ($N_p$).

In addition to thermal tuning, embodiments of the present invention can utilize current tuning based on the Kramer-Kronig relation.

Figure 6:
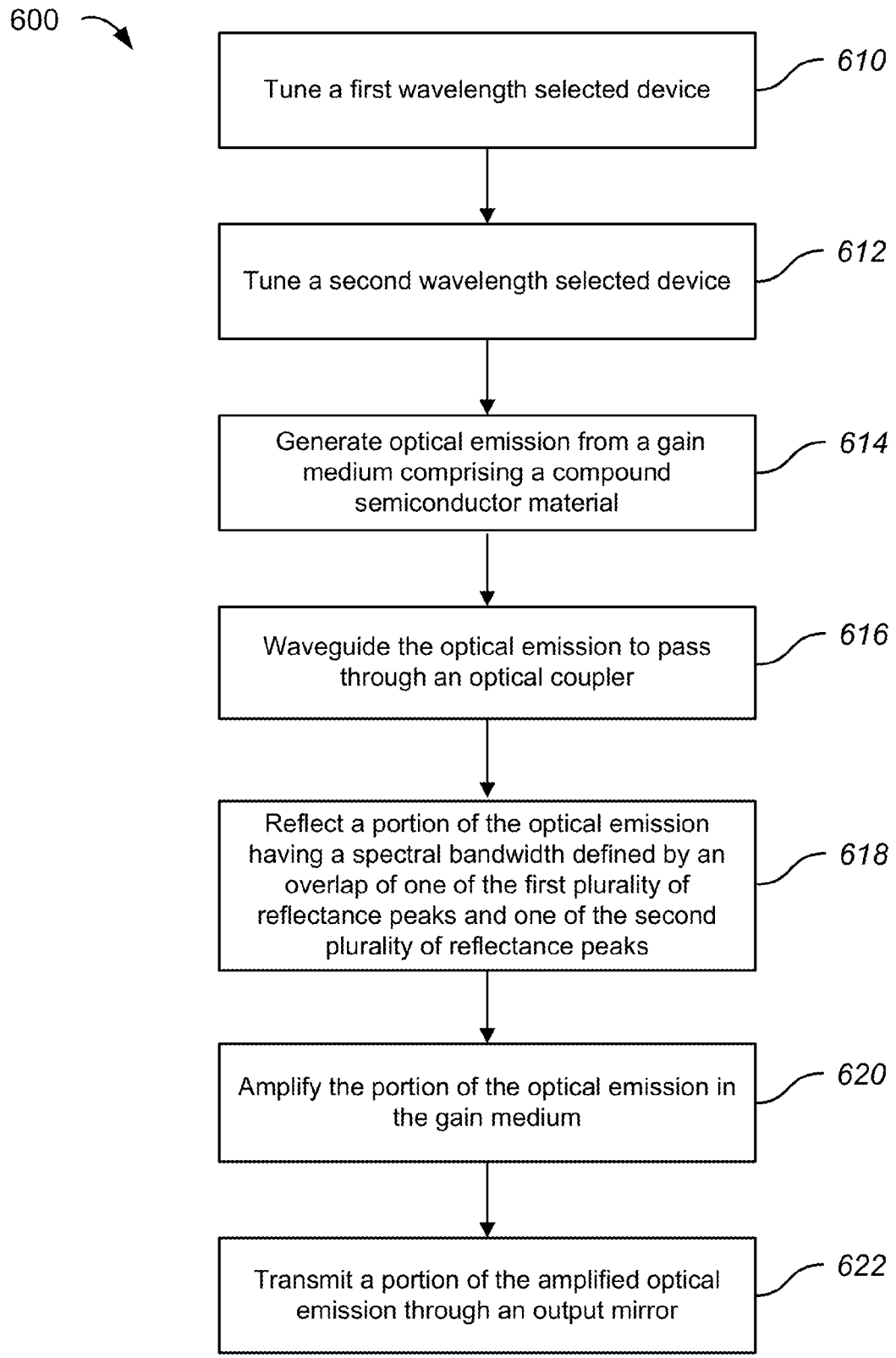
FIG. 6 is a simplified flowchart illustrating a method of operating a hybrid integrated laser according to an embodiment of the present invention.

FIG. 6 is a simplified flowchart illustrating a method of operating a hybrid integrated laser according to an embodiment of the present invention. The method 600, which may be utilized in operating a tunable laser, includes tuning a first wavelength selective device (e.g., a first modulated grating reflector disposed in a silicon layer of an SOI wafer) (610) and tuning a second wavelength selective device (e.g., a second modulated grating reflector disposed in the silicon layer of the SOI wafer) (612). The first wavelength selective device is characterized by a first reflectance spectra including a first plurality of reflectance peaks. The second wavelength selective device is characterized by a second reflectance spectra including a second plurality of reflectance peaks. In a particular embodiment, a first modulated grating reflector includes a superstructure grating characterized by a first wavelength spacing between modes and a second modulated grating reflector includes a superstructure grating characterized by a second wavelength spacing between modes that is different than the first wavelength spacing between modes. The wavelength selective devices can include index of refraction adjustment devices such as thermal devices that enable the tuning functionality that is provided. In applications with thermal devices, temperature sensors such as RTDs can be used to monitor and control thermal inputs. One of ordinary skill in the art would recognize many variations, modifications, and alternatives.

The method also includes generating optical emission from a gain medium comprising a compound semiconductor material (614) and waveguiding the optical emission to pass through an optical coupler (616). The optical emission may pass through a phase adjustment region. The method further includes reflecting a portion of the optical emission having a spectral bandwidth defined by an overlap of one of the first plurality of reflectance peaks and one of the second plurality of reflectance peaks (618), amplifying the portion of the optical emission in the gain medium (620), and transmitting a portion of the amplified optical emission through an output mirror (622).

It should be appreciated that the specific steps illustrated in FIG. 6 provide a particular method of operating a hybrid integrated laser according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7A:
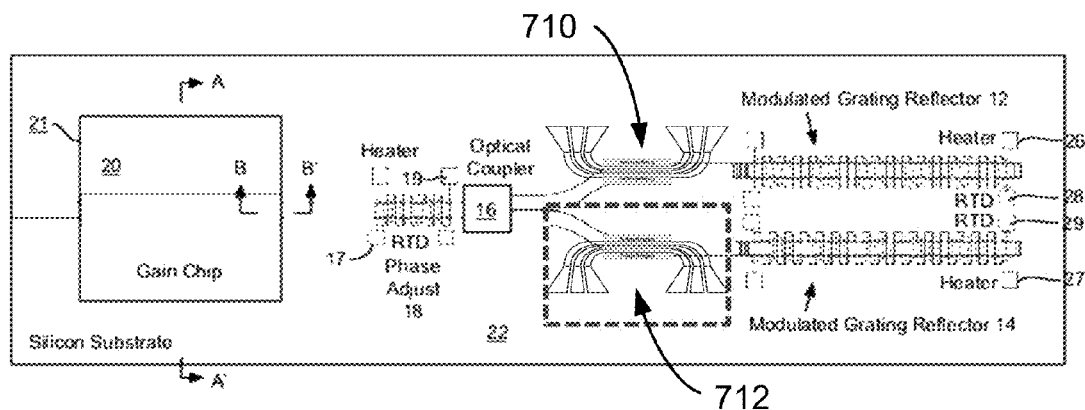
FIG. 7A is a simplified schematic diagram illustrating a hybrid tunable laser with integrated carrier-induced phase controllers according to an embodiment of the present invention.

FIG. 7A is a simplified schematic diagram illustrating a hybrid tunable laser with integrated carrier-induced phase controllers according to an embodiment of the present invention. Additional description related to hybrid tunable elements is provided in U.S. patent application Ser. No. 12/903, 025, filed on Oct. 12, 2010, the disclosure of which is hereby incorporated by reference in its entirety for all purposes.

One approach to control the laser output of the device illustrated in FIG. 7A is to perform direct modulation of the gain chip 20, effectively switching the gain material off and on. Embodiments of the present invention provide an alternative control technique utilizing a diode effect, which can be referred to as diode modulation. Accordingly, embodiments of the present invention can modulate the laser while not modifying the gain properties of the gain chip 20. As described below, modulation of the output is produced by using the phase relationship between light waves propagating in two waveguides integrated into the system. As illustrated in FIG. 7A, a first waveguide 710 is disposed between optical coupler 18 and modulated grating reflector 12 and a second waveguide 712 is disposed between optical coupler 18 and modulated grating reflector 14.

As described more fully herein, the lasing cavity includes the gain chip 20 as well as the two branches to the right of the optical coupler, including the waveguides with integrated carrier-induced phase controllers and modulated grating reflectors. For purposes of illustration, one branch is outlined in FIG. 7A, but the description is applicable to either or both branches and the waveguides in these branches. By adjusting the phase relationship of the waves propagating in at least one of or both of the two branches, the output of the laser can be modulated. By adjusting the phase in one or both of the two branches, the phase of the reflected wave associated with the peaks of the modulating grating reflectors is shifted. In embodiments of the present invention, phase is introduced in one or both of the waveguide sections adjacent to the grating structures, resulting in a change in the phase of the reflection peaks with respect to the other waveguide section. Thus, although the amplitudes of the peaks are still spectrally aligned, the phases become misaligned, reducing or eliminating the combined reflection from the grating structures, resulting in no feedback reaching the optical combiner. As the feedback in the laser resonator is varied (e.g., reduced), the laser output can be modulated (e.g., turned off). It should be appreciated that in some embodiments, the phase control described herein is used to control the effective reflectivity of the combined grating structures, not to tune the spectral response of the grating structures. By driving both phase controllers concurrently, the drive voltages used to achieve a predetermined phase adjustment can be decreased. One of ordinary skill in the art would recognize many variations, modifications, and alternatives.

Figure 7B:
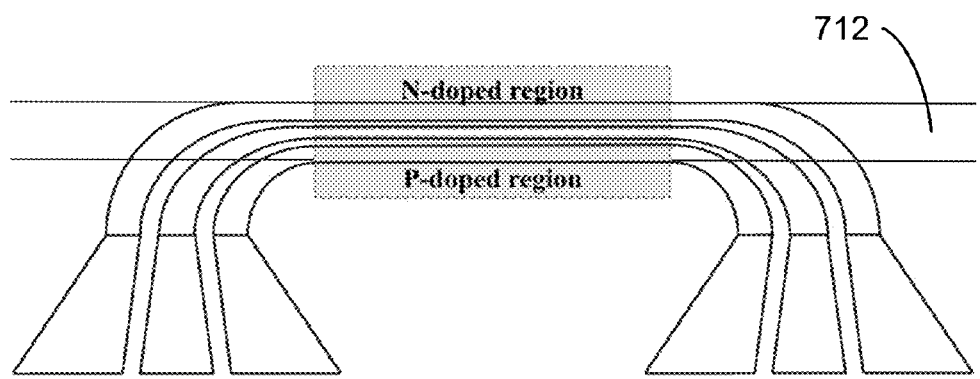
FIG. 7B is a simplified schematic diagram illustrating the carrier-induced phase controllers illustrated in FIG. 7A.

FIG. 7B is a simplified schematic diagram illustrating the carrier-induced phase controllers illustrated in FIG. 7A. As illustrated in FIG. 7B, waveguide 712, which is one of the waveguides illustrated in FIG. 7A, includes a p-i-n junction diode structure optically coupled to the waveguide. Although a p-i-n diode structure is illustrated, this is not required by the present invention and other structures that can introduce a phase shift in the waves propagating in the waveguide are included within the scope of the invention, including p-n junction diodes, metal-insulator-metal structures, metal-insulator-semiconductor structures, metal-semiconductor-metal structures, bipolar transistors, field-effect transistors, tunnel diodes, and the like.

In the implementation of phase control illustrated in FIG. 7B, a p-doped region is present on one side of the waveguide and an n-doped region is present on the other side of the waveguide. Thus, a p-i-n diode implemented in silicon is used to inject carriers and thereby change the index of refraction of the material in the waveguide. As will be evident to one of skill in the art, changing the index of refraction results in a phase change for the waves propagating in the waveguide, which is located inside the laser cavity (i.e., intracavity). Thus, intracavity diodes are utilized to provide carrier injection and phase control according to embodiments of the present invention.

A variety of carrier effects can be achieved, including formation of a depletion region or formation of an accumulation region in the waveguide and the material in the vicinity of the waveguide. A benefit provided by embodiments of the present invention is that the phase adjustment based on carrier induced index changes can be very rapid. For example, using carrier injection, modulation of the laser could be at frequencies up to and above 1 GHz, which can be achieved based on the time associated with carrier injection in silicon materials. Moreover, using carrier depletion, modulation frequencies can be higher, for example, up to and above 40 GHz. Additionally, in addition to carrier injection, thermal modification of the phase can be applied to the waveguides to introduce phase delay in the waves propagating in the waveguide. Three electrodes are illustrated in FIG. 7B, for example, ground, signal, ground, which is suitable for a transmission line driven using RF signals. One of ordinary skill in the art would recognize many variations, modifications, and alternatives.

Figure 7C:
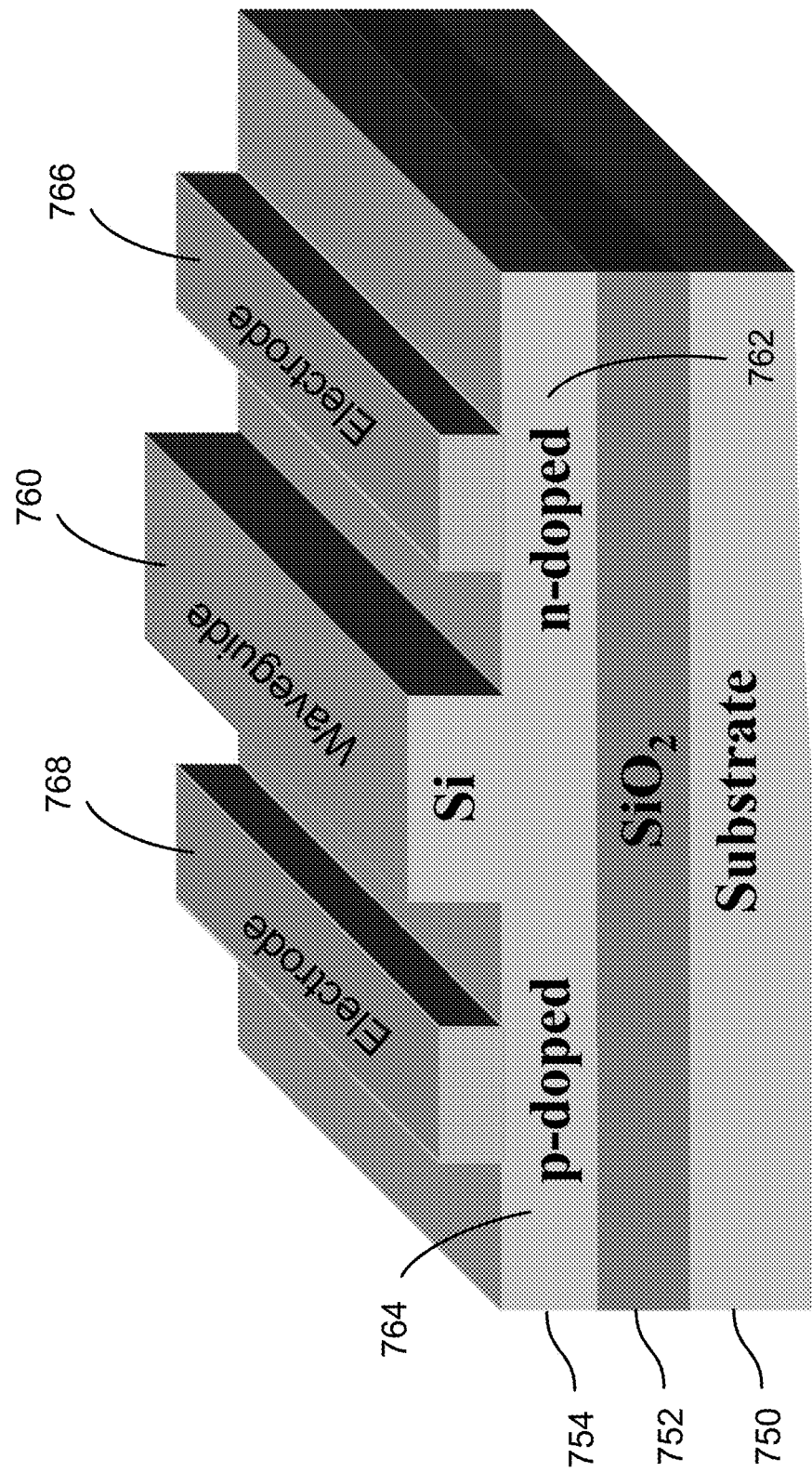
FIG. 7C is a simplified perspective diagram of a carrier-induced phase controller according to an embodiment of the present invention.

FIG. 7C is a simplified perspective diagram of a carrier-induced phase controller according to an embodiment of the present invention. Referring to FIG. 7C, an SOI substrate including a silicon substrate 750, an insulating layer 752 (e.g., $SiO_2$), and a silicon layer 754 is utilized to form the waveguide regions (e.g., waveguide 712). The waveguide ridge 760 is formed, using, for example, a masking and etching process to remove portions of the silicon layer 754 coupled to the $SiO_2$ layer 752. The doped regions are then formed, for example, using masking and ion implantation (e.g., followed by diffusion and/or annealing), to form n-doped region 762 adjacent one side of the waveguide ridge 760 and p-type region 764 adjacent the other side of the waveguide ridge. Electrodes 766 and 768 are formed, for example, using a patterning and deposition process, to provide electrical connections to the doped regions, enabling application of bias to the terminals of the diode structure. In the illustrated embodiment, the silicon layer 754 is undoped, resulting in the formation of a p-i-n diode structure. In other embodiments, a p-n diode can be formed by reducing the thickness of the undoped region.

As illustrated in FIGS. 7A-7C, embodiments of the present invention provide for carrier-based control of phase in a tunable laser waveguide. The phase can be controlled via refractive index changes induced using carrier injection, accumulation, or depletion depending on the particular architecture utilized. In some embodiments, the relationship between carriers and refractive index for silicon-based devices can be described by the following equation:

$$\Delta n = -[8.8 \times 10^{-22} \times \Delta n_e + 6.0 \times 10^{-18} \times (\Delta n_h)^{0.8}]$$

Figure 8A:
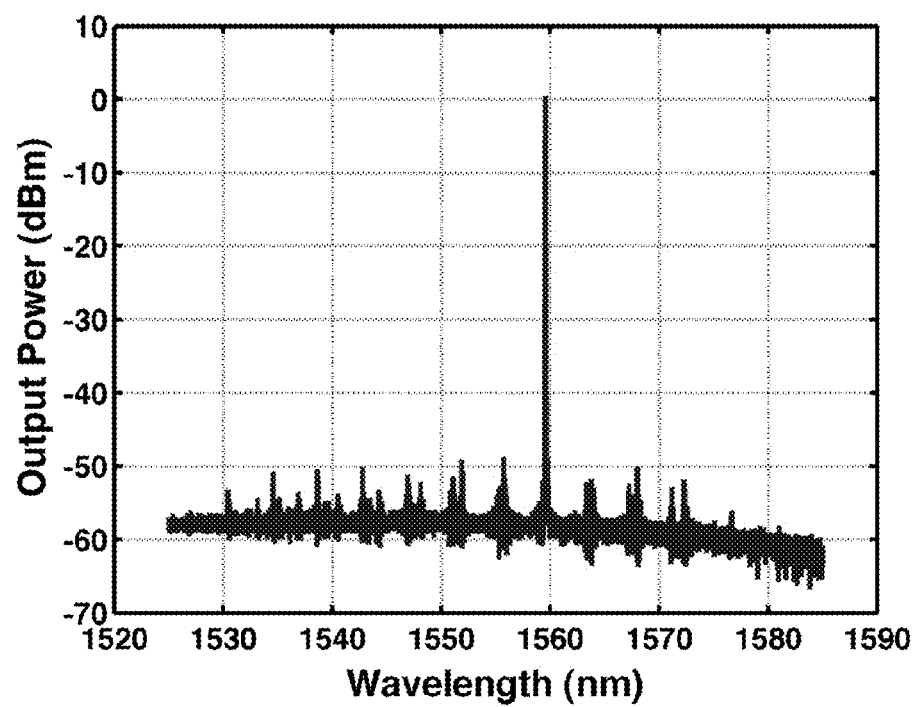
FIG. 8A is a plot illustrating the output of the laser without phase shift applied to the carrier-induced phase controller according to an embodiment of the present invention.
Figure 8B:
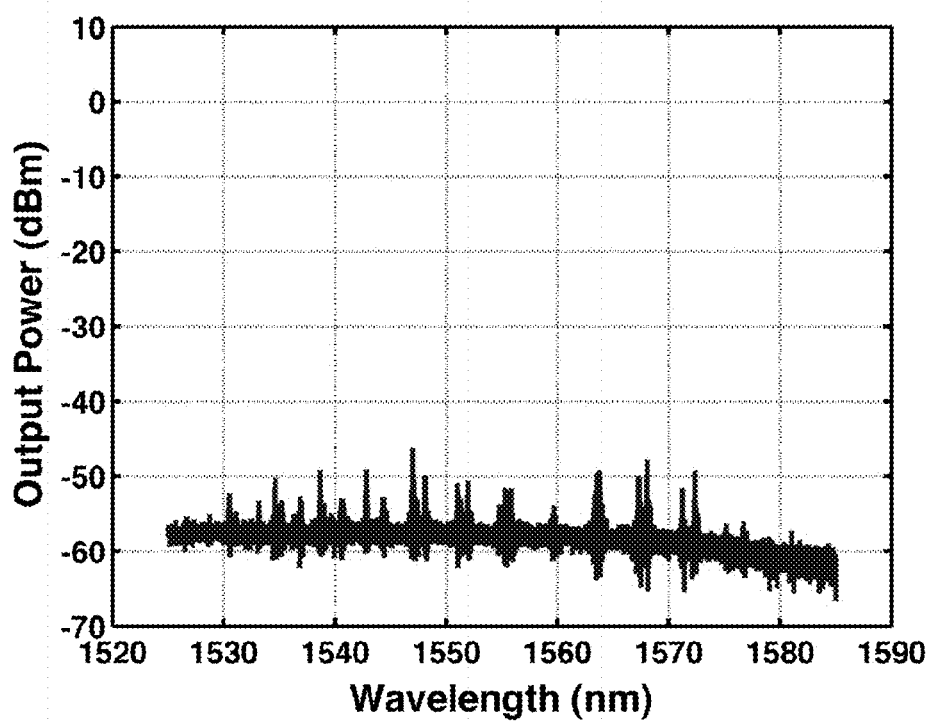
FIG. 8B is a plot illustrating the output of the laser with phase shift applied to the carrier-induced phase controller according to an embodiment of the present invention.

FIG. 8A is a plot illustrating the output of the laser without phase shift applied to the carrier-induced phase controller according to an embodiment of the present invention. As illustrated in FIG. 8A, the laser output is characterized by a single mode output at a wavelength of ~1560 nm when the input to the phase control sections is zero. FIG. 8B is a plot illustrating the output of the laser with phase shift applied to the carrier-induced phase controller according to an embodiment of the present invention. When the phase shift is applied to one of the phase controllers, the single mode output is extinguished, as shown in the plot. Utilizing embodiments of the present invention, the inventors have demonstrated a DC extinction ratio in excess of 40 dB by application of the phase shift using one or both of the phase controllers.

Figure 9:
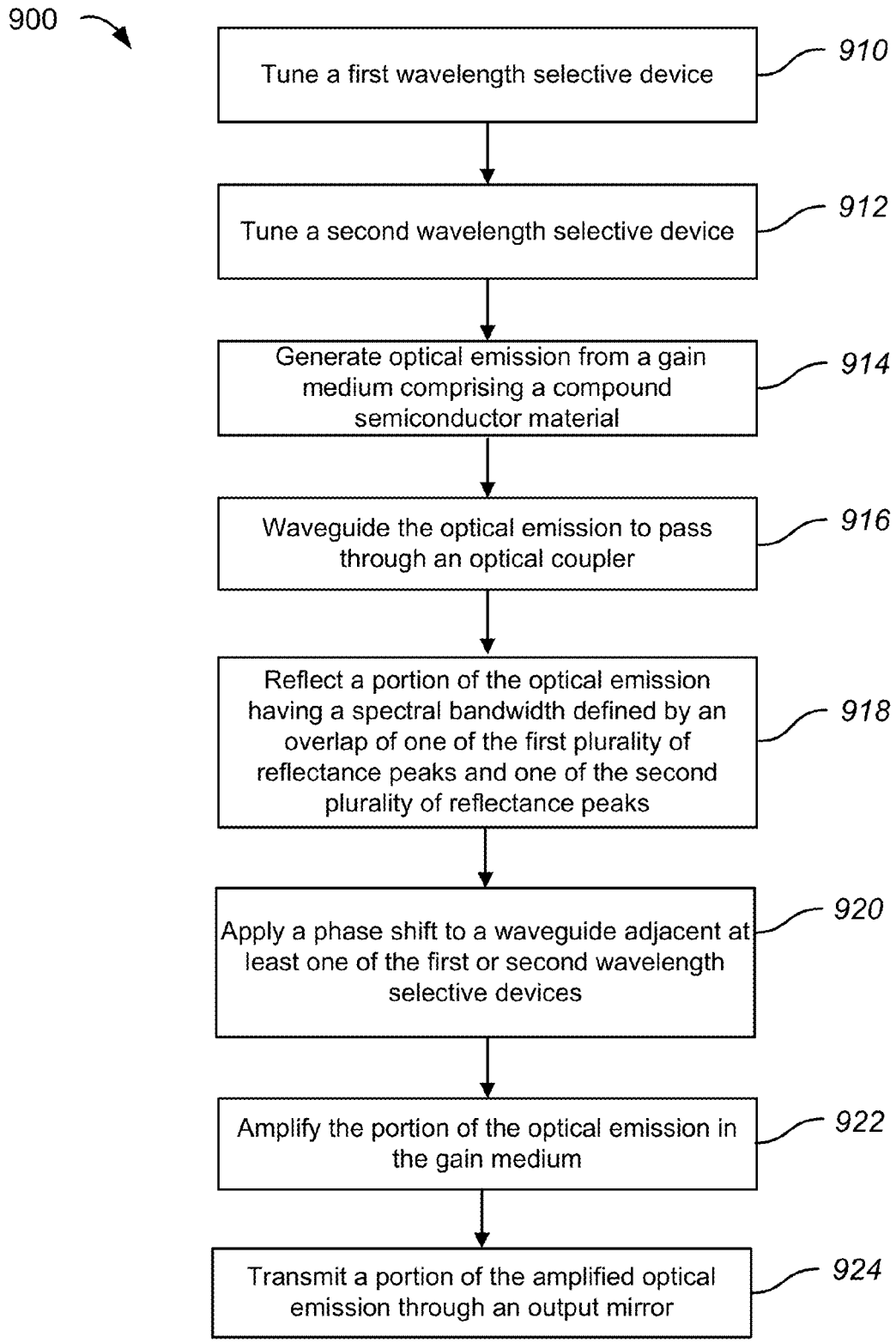
FIG. 9 is a simplified flowchart illustrating a method of operating a hybrid tunable laser with integrated carrier-induced phase controllers according to an embodiment of the present invention.

FIG. 9 is a simplified flowchart illustrating a method of operating a hybrid tunable laser with integrated carrier-induced phase controllers according to an embodiment of the present invention. FIG. 9 shares some common elements with FIG. 6 and the description provided in relation to FIG. 6 is applicable to FIG. 9 as appropriate. The method includes applying a phase shift to a waveguide adjacent at least one of the first or second wavelength selective devices (920). Depending on the implementation, the phase shift can be applied using a thermal effect, a carrier-based effect, or a combination thereof. The phase shift will enable modulation control of the output of the laser resonator as described herein. Amplification of the portion of the optical emission in the gain medium (922) is performed. In one phase of the modulation technique, no phase shift is applied and the method will include transmitting a portion of amplified optical emission through an output mirror (924). Additional description related to hybrid tunable lasers is provided in U.S. patent application Ser. No. 13/040,179, filed on Mar. 3, 2011, the disclosure of which is hereby incorporated by reference in its entirety for all purposes.

It should be appreciated that the specific steps illustrated in FIG. 9 provide a particular method of operating a hybrid tunable laser with integrated carrier-induced phase controllers according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 10:
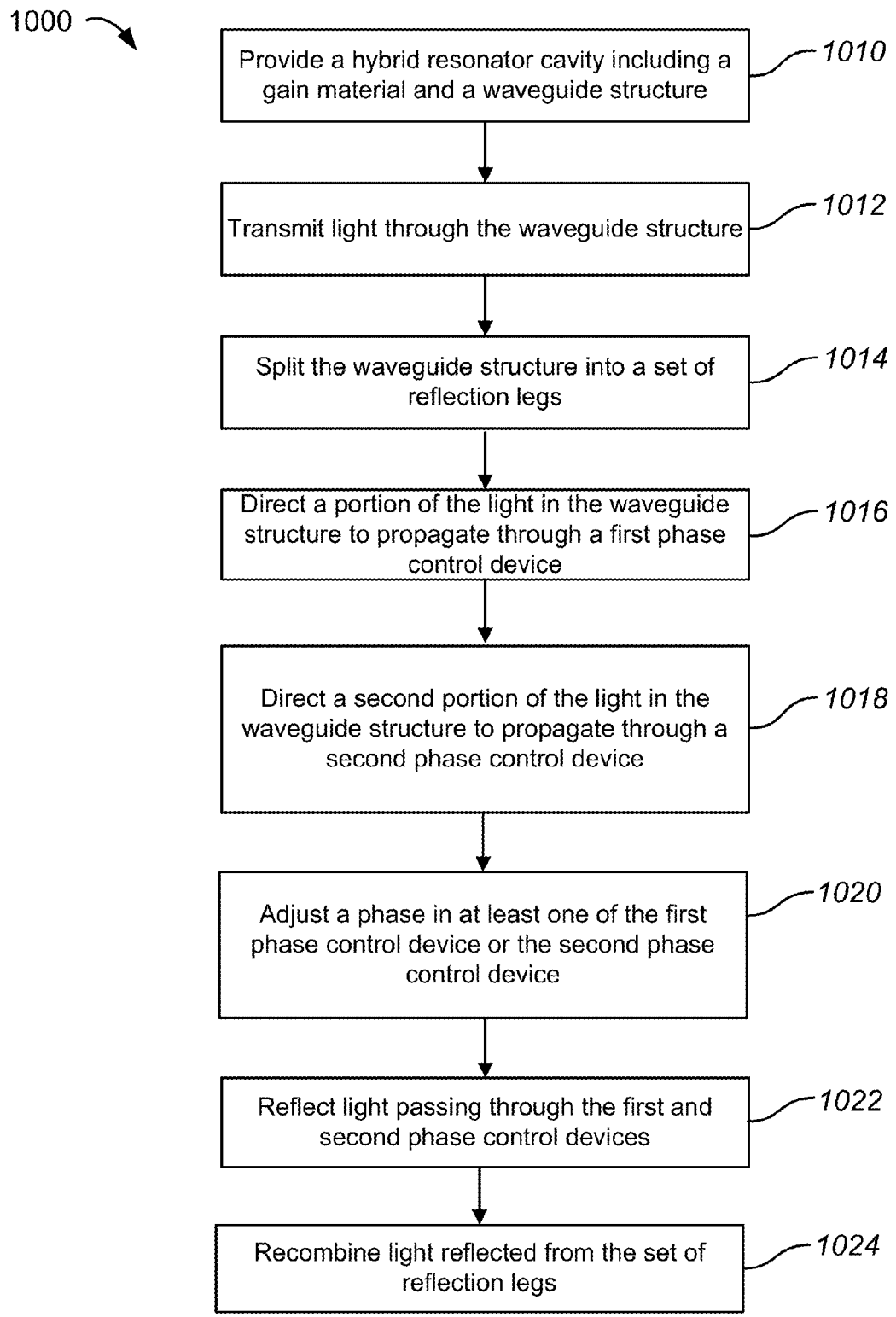
FIG. 10 is a simplified flowchart illustrating a method of operating a tunable laser according to an embodiment of the present invention.

FIG. 10 is a simplified flowchart illustrating a method of operating a tunable laser according to an embodiment of the present invention. The method 1000 includes providing a hybrid resonator cavity including a gain material and a waveguide structure coupled to the gain material (1010), transmitting light through the waveguide structure (1012), and splitting the waveguide structure into a set of reflection legs (1014). The method also includes directing a portion of the light in the waveguide structure to propagate through a first phase control device (1016) and directing a second portion of the light in the waveguide structure to propagate through a second phase control device (1018).

The method further includes adjusting a phase in at least one of the first phase control device or the second phase control device (1020), reflecting light passing through the first phase control device and reflecting light passing through the second phase control device (1022), and recombining light reflected from the set of reflection legs (1024).

In an embodiment, the set of reflection legs includes a first modulated grating reflector and a second modulated grating reflector. As an example, the first modulated grating reflector can include a superstructure grating characterized by a first wavelength spacing between modes and the second modulated grating reflector can included a superstructure grating characterized by a second wavelength spacing between modes different than the first wavelength spacing between modes. In some embodiments, the waveguide structure comprises a silicon material such as a silicon on insulator wafer. Adjusting the phase in at least one of the first phase control device or the second phase control device can include adjusting the phase in both the first phase control device and the second phase control device.

It should be appreciated that the specific steps illustrated in FIG. 10 provide a particular method of operating a tunable laser according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A tunable laser comprising:
    a substrate comprising a silicon material and a recess;
    a gain medium disposed in the recess in the substrate, wherein the gain medium includes a compound semiconductor material;
    a waveguide disposed in the substrate and optically coupled to the gain medium;
    a first wavelength selective element characterized by a first reflectance spectrum and disposed in the substrate;
    a carrier-based phase modulator optically coupled to the first wavelength selective element, wherein the carrier-based phase modulator introduces charge carriers into a wave-guiding portion of the tunable laser between the gain medium and the first wavelength selective element to extinguish lasing of the tunable laser;
    a second wavelength selective element characterized by a second reflectance spectrum and disposed in the substrate, wherein the second reflectance spectrum overlaps a portion of the first reflectance spectrum such that the tunable laser operates at a single-mode output;
    an optical coupler disposed in the substrate and optically coupled to the first wavelength selective element, the second wavelength selective element, and the waveguide;
    an output mirror; and
    a phase adjustment section for correction of phase misalignment.

2. The tunable laser of claim 1 wherein the carrier-based phase modulator comprises a p-i-n diode optically coupled to a waveguide disposed between the optical coupler and the first wavelength selective element.

3. The tunable laser of claim 1 further comprising a second carrier-based phase modulator optically coupled to the second waveguide selective element.

4. The tunable laser of claim 3 wherein the second carrier-based phase modulator comprises a p-i-n diode optically coupled to a waveguide disposed between the optical coupler and the second wavelength selective element.

5. The tunable laser of claim 1 wherein the waveguide comprises a silicon material.

6. The tunable laser of claim 1 wherein the substrate comprises a silicon on insulator wafer.

7. The tunable laser of claim 1 wherein the carrier-based phase modulator comprises a p-i-n diode.

8. The tunable laser of claim 7 wherein the waveguide comprises an intrinsic portion of the p-i-n diode.

9. The tunable laser of claim 1 wherein the recess in the substrate comprises an interface and the gain medium has a facet separated from the interface by an index matching region.

10. The tunable laser of claim 1, the tunable laser further comprising a second waveguide, wherein:
    the second waveguide is used to connect the optical coupler with the first wavelength selective element; and
    the second waveguide is the wave-guiding portion of the tunable laser that the carrier-based phase modulator introduces charge carriers into.

11. The tunable laser of claim 10, the tunable laser further comprising:
    a second carrier-based phase modulator; and
    a third waveguide, wherein:
    the third waveguide is used to connect the optical coupler with the second wavelength selective element; and
    the second carrier-based phase modulator introduces charge carriers into the third waveguide.

12. The tunable laser of claim 1 wherein the phase adjustment section uses heat for correction of phase misalignment.

13. A method of operating a tunable laser, the method comprising:
    providing a hybrid resonator cavity including a gain material and a waveguide structure coupled to the gain material, wherein the hybrid resonator cavity comprises a substrate having a recess and the gain material is disposed in the recess in the substrate;
    transmitting light through the waveguide structure;
    correcting phase misalignment of the light through the waveguide structure by heating a phase adjustment section;
    splitting the waveguide structure into a set of reflection legs;
    directing a first portion of the light in the waveguide structure to propagate through a first phase modulator;
    directing a second portion of the light in the waveguide structure to propagate through a second phase modulator;

adjusting a phase in at least one of the first phase modulator or the second phase modulator by introducing charge carriers into a wave-guiding portion of the at least one of the first phase modulator or the second phase modulator;

reflecting light passing through the first phase modulator;

reflecting light passing through the second phase modulator; and recombining light reflected from the set of reflection legs.

14. The method of claim 13 wherein the set of reflection legs comprises:

a first modulated grating reflector; and a second modulated grating reflector.

15. The method of claim 14 wherein the first modulated grating reflector comprises a superstructure grating characterized by a first wavelength spacing between modes.

16. The method of claim 15 wherein the second modulated grating reflector comprises a superstructure grating characterized by a second wavelength spacing between modes different than the first wavelength spacing between modes, and the method further comprises aligning a mode of the first modulated grating reflector with a mode of the second modulated grating reflector.

17. The method of claim 13 wherein the waveguide structure comprises a silicon material.

18. The method of claim 17 wherein the silicon material comprises a silicon on insulator wafer.

19. The method of claim 13 wherein adjusting the phase in at least one of the first phase modulator or the second phase modulator comprises adjusting the phase in both the first phase modulator and the second phase modulator.

20. The method of claim 13 wherein the recess in the substrate comprises an interface and the gain medium has a facet separated from the interface by an index matching region.

* * * * *